United States Patent
Shinmori

(10) Patent No.: US 6,630,707 B1
(45) Date of Patent: Oct. 7, 2003

(54) SEMICONDUCTOR DEVICE INCLUDING LOGIC CIRCUIT AND MEMORY CIRCUIT

(75) Inventor: Masahiro Shinmori, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/456,978

(22) Filed: Dec. 7, 1999

(30) Foreign Application Priority Data

Dec. 9, 1998 (JP) .......................................... 10-349883

(51) Int. Cl.[7] .............................................. H01L 29/788
(52) U.S. Cl. ...................... 257/315; 257/316; 257/326; 257/532; 257/535
(58) Field of Search ................................ 257/315, 316, 257/296, 326, 532, 535, 321, 322; 438/256, 257, 258

(56) References Cited

U.S. PATENT DOCUMENTS

| | | | | |
|---|---|---|---|---|
| 5,508,957 A | * | 4/1996 | Momodomi | 365/185.17 |
| 5,760,437 A | * | 6/1998 | Shimoji | 257/316 |
| 5,900,661 A | * | 5/1999 | Sato | 257/315 |
| 5,986,933 A | * | 11/1999 | Takeuchi | 365/185.12 |
| 5,990,514 A | * | 11/1999 | Choi | 257/315 |
| 6,084,262 A | * | 7/2000 | Chi | 257/322 |
| 6,114,767 A | * | 9/2000 | Nagai | 257/758 |
| 6,177,716 B1 | * | 1/2001 | Clark | 257/532 |
| 6,214,665 B1 | * | 4/2001 | Sakui | 438/257 |
| 6,240,012 B1 | * | 5/2001 | Nakamura | 257/315 |

FOREIGN PATENT DOCUMENTS

| | | |
|---|---|---|
| JP | 63-10395 | 1/1988 |
| JP | 2-263387 | 10/1990 |

\* cited by examiner

*Primary Examiner*—Wael Fahmy
*Assistant Examiner*—Nathan W. Ha
(74) *Attorney, Agent, or Firm*—Foley & Lardner

(57) ABSTRACT

The semiconductor device with its primary bit line and secondary bit lines, according to the present invention, is capable of being accessed at a high speed. In this semiconductor device, any one of a plurality of secondary bit lines is selectively connected to the primary bit line. The primary bit line 1 and secondary bit lines 3 are all formed on the same insulating film 26. A lined layer of wiring 15 for a memory cell selection word line 8 is formed on an insulating film 27.

16 Claims, 14 Drawing Sheets

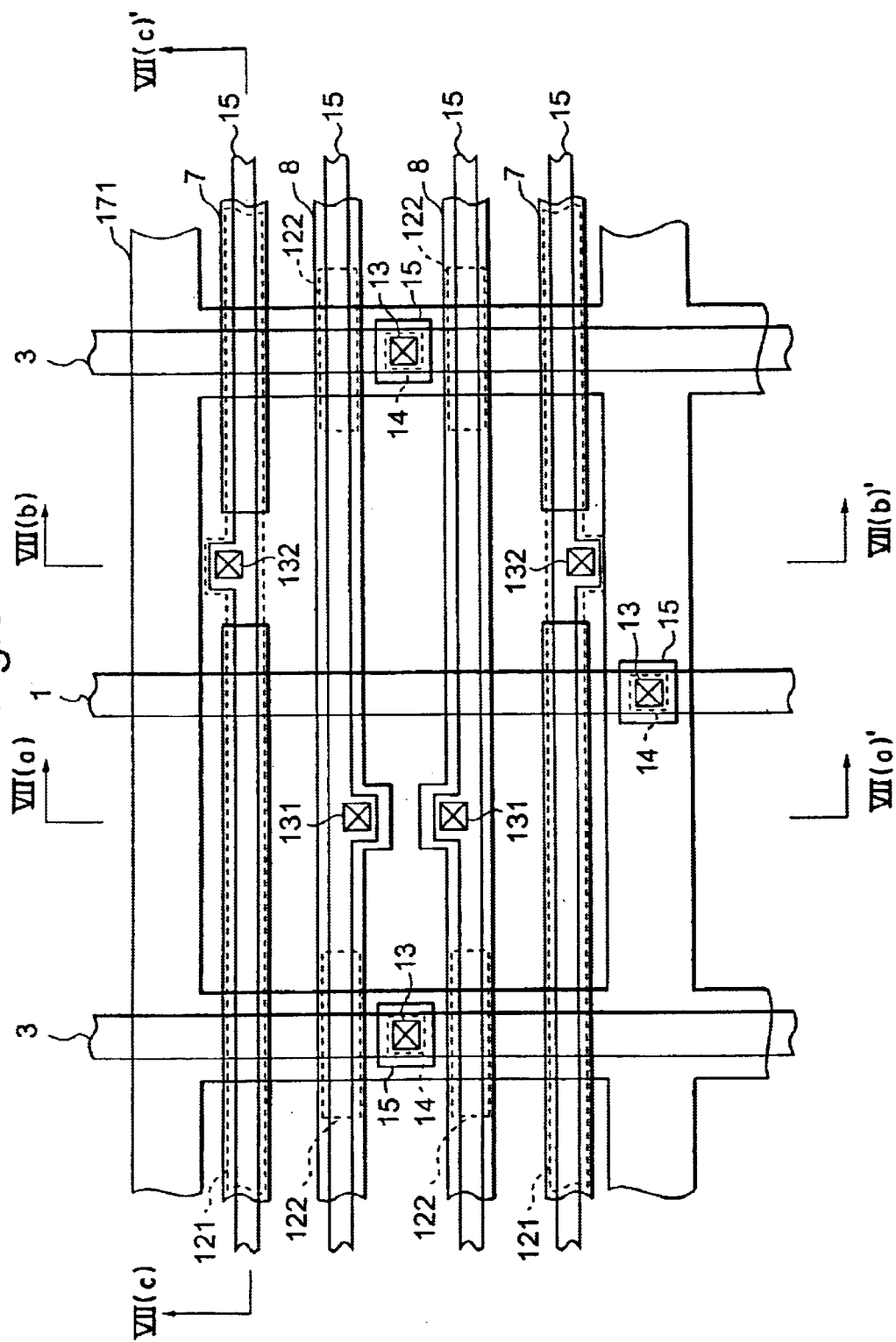

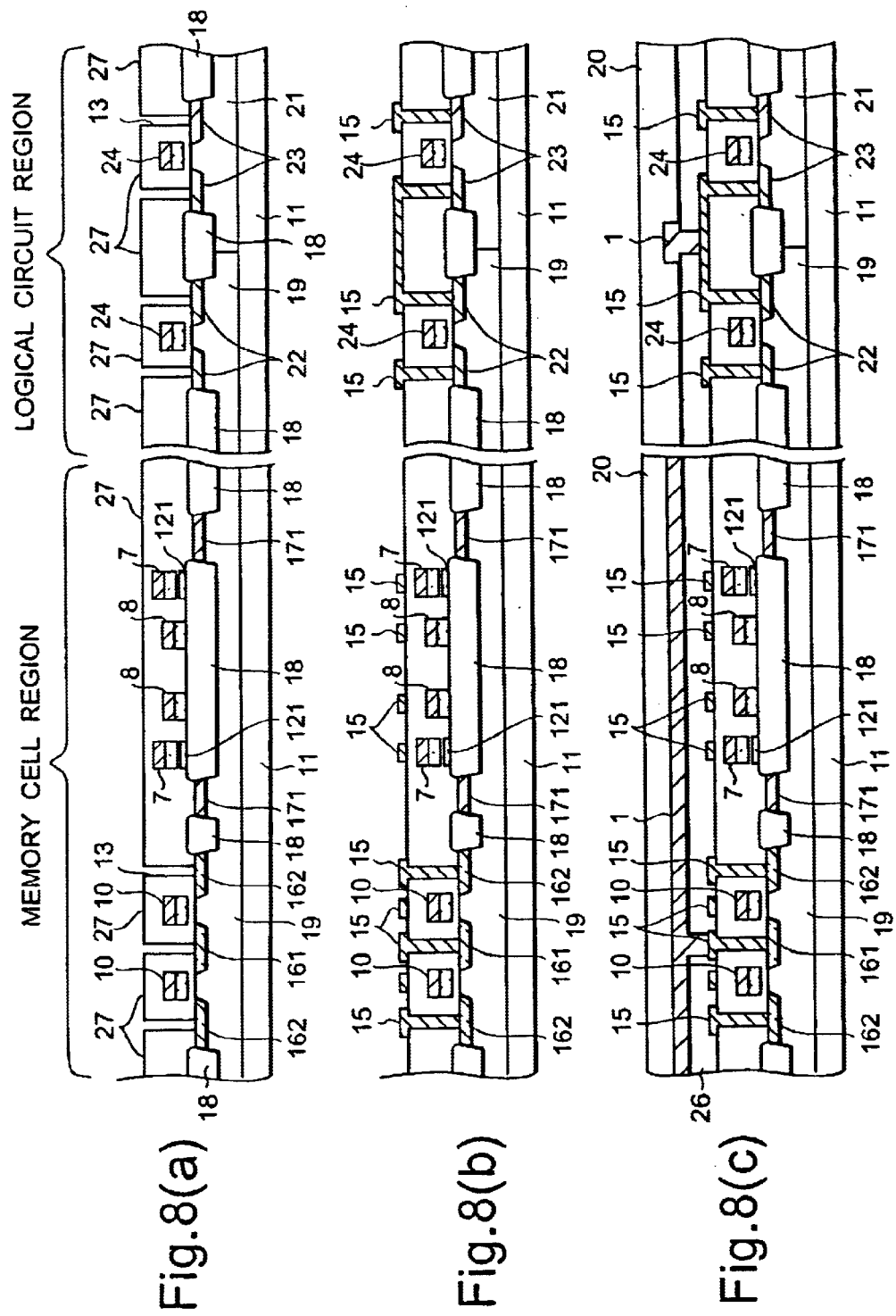

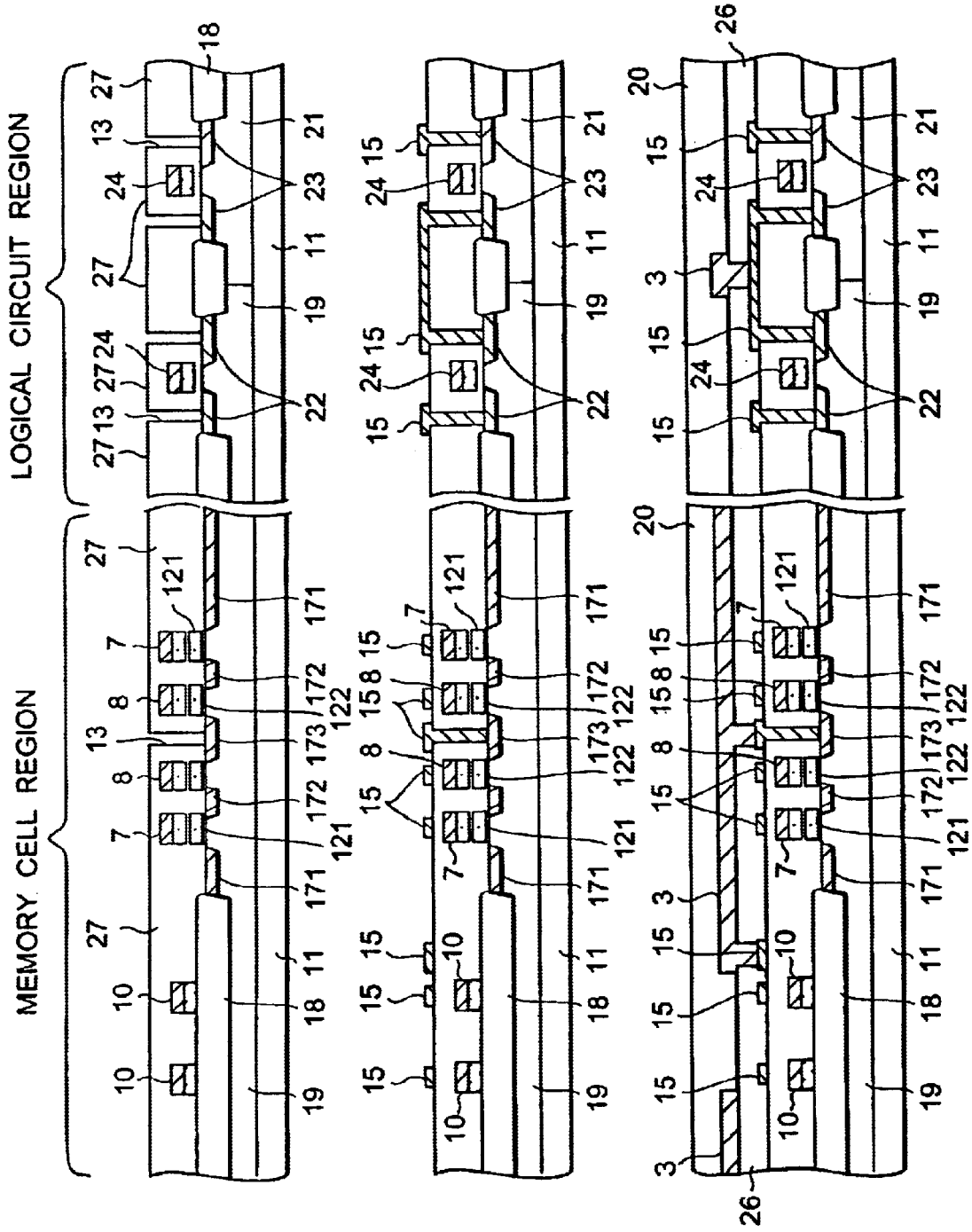

SEMICONDUCTOR DEVICE INCLUDING LOGIC CIRCUIT AND MEMORY CIRCUIT

BACKGROUND OF THE INVENTION

1. Field of the Invention

The present invention relates to a semiconductor device, particularly one which is comprised of logic circuits and memory circuits.

2. Description of the Related Art

In recent years, attention has been paid to flash memory because it is a nonvolatile semiconductor memory, which is suitable to improve integration (increase capacity). A flash memory cell basically consists of a memory cell with a floating gate. Depending on the accumulation of electric charge in this floating gate, the threshold of the memory cell transistor changes, which means that the information is stored. In this fashion, because the memory cell in flash memory consists of basically only one memory cell transistor, the area occupied by one memory cell is small; thereby improving integration.

However, since flash memory is comprised of only one transistor being used as a memory cell transistor, it is necessary to very precisely adjust the threshold of the memory cell transistor.

Namely, in flash memory, because each memory cell is not fitted with a selection transistor, it is necessary for each memory cell to use its own threshold voltage to decide whether it is selected or not. Due to this, it is not enough for simply each cell to be set to 'high threshold' or 'low threshold' dependent upon which information (i.e., either a logical level of '1' or '0') needs to be stored. For example, when storing a certain logical level (writing data) in a memory cell, the threshold voltage of that memory cell transistor is set at or above the gate voltage at the time the memory cell transistor is selected. On the other hand, when storing the other logical level (erasing data) in the memory cell, it is necessary to set the threshold voltage of that memory cell transistor at or below the gate voltage of the memory cell transistor at the time it was selected, but at or above the gate voltage at the time of de-selecting.

For this purpose, when writing data it is unnecessary to accurately adjust the threshold of the memory cell transistor. However, when erasing data it is necessary to very accurately adjust the threshold for it to fall within the above-mentioned range.

Supposing the erase data threshold voltage becomes excessively low, it would go below the de-selected gate voltage. Then regardless of whether it is selected or de-selected, the memory cell transistor would become normally conductive, unable to read-out and it would have what is called 'excessive erasure'. Moreover, flash memory has as a feature the one-time block-erasure, but the erasure of the large number of memory cells included in each block is not even; it is dispersed. Because of this, there is much difficulty in getting the erasure threshold voltages of the large number of memory cells erased at one time to fall within the above-mentioned range.

In order to prevent this problem of excessive erasure, various means have been suggested, including the usage of a selective transistor. Using the selective transistor, even when the memory cell transistor is excessively erased, the selective transistor is certain to maintain the non-conductivity of the de-selected memory cell transistor. Accordingly, it is unnecessary for the memory cell transistor threshold voltage to fall within the above-mentioned range at the time of erasure, thereby simplifying the erase function. Meeting the demand for improving the memory access speed, the following type of flash memory has lately attracted attention: the flash memory which uses memory cell transistors and selective transistors, and which is structured as a memory cell array with a primary bit line and secondary bit lines. This type of flash memory makes good use of a technique that controls the possible increase in parasitic capacities caused by the connection of many memory cells to one bit line, and thereby shortening the charging/discharging time of each bit line. To briefly describe this technique any one of m-number of secondary bit lines, each being connected to n-number of memory cells, is selected by m-number of secondary bit line selection transistors, and as a result, is connected to the primary bit line. Consequently, since usually only one secondary bit line is connected to the primary bit line, the parasitic capacities include only the capacities of the primary bit line, the selected, secondary bit line and the n-number of memory cells. Compared to the conventional structure without the primary/secondary bit line arrangement, the total amount of parasitic capacities to be charged and discharged at the time of selection is decreased.

This memory cell array structure, as shown in FIG. 1, is comprised of the following components: the first layer of secondary bit line 103, the second layer of primary bit line 101, a memory cell selective transistor 105 with its source of diffused layer 106, a memory cell 104, and a secondary bit line selective transistor 102. The source of the memory cell 104 is connected to the drain of the memory cell selective transistor 105, whereas the drain of it is connected to the secondary bit line 103. A device separation region 107 separates the secondary bit line selective transistors 102. The source of the transistor 102 is connected to the secondary bit line 103, whereas the drain of it is connected to the primary bit line 101. In this conventional memory cell array structure, the second layer of primary bit lines 101 is made of aluminum wiring, and the first layer of secondary bit line 103 is made of polysilicon wiring.

Since the secondary bit line utilizes polysilicon wiring in the conventional structure, other processes than the one of forming the logic circuit with the metal wiring used for the first layer of wiring so as to facilitate high-speed functioning are needed to form non-volatile memory. This causes an increase in cost when manufacturing a semiconductor device with a hybridized memory/logic circuit. Furthermore, due to the utilization of polysilicon wiring by the secondary bit line, the resistance value of the secondary bit line increases. As a result, the number of memory cells connected to the secondary bit line cannot be increased, nor can the operating speed be increased.

SUMMARY OF THE INVENTION

Accordingly, the purpose of this invention is to provide a semiconductor device with hybridized non-volatile memory/logic circuits, which is fabricated in such a manner that the interconnecting process of the non-volatile memory circuit is shared with the logic circuit interconnecting process, and thereby reducing the resistance of the secondary bit lines and also increasing the speed of accessing the non-volatile memory circuit.

BRIEF DESCRIPTION OF DRAWINGS

The above and other objects, features and advantages of the present invention will become more apparent from the following detailed description, when taken in conjunction with the accompanying drawings, wherein:

FIG. 6 is an aerial view showing an interconnection of lined wiring, according to the first embodiment of the present invention;

FIGS. 8(a) to 8(c) illustrate the process steps of manufacturing the first embodiment of the present invention;

FIGS. 9(a) to 9(c) illustrate the process steps of manufacturing the first embodiment of the present invention;

DETAILED DESCRIPTION OF THE PREFERRED EMBODIMENTS

Hereafter, several embodiments of the present invention will be described with reference to the drawings.
(First Embodiment)

Figure 1:
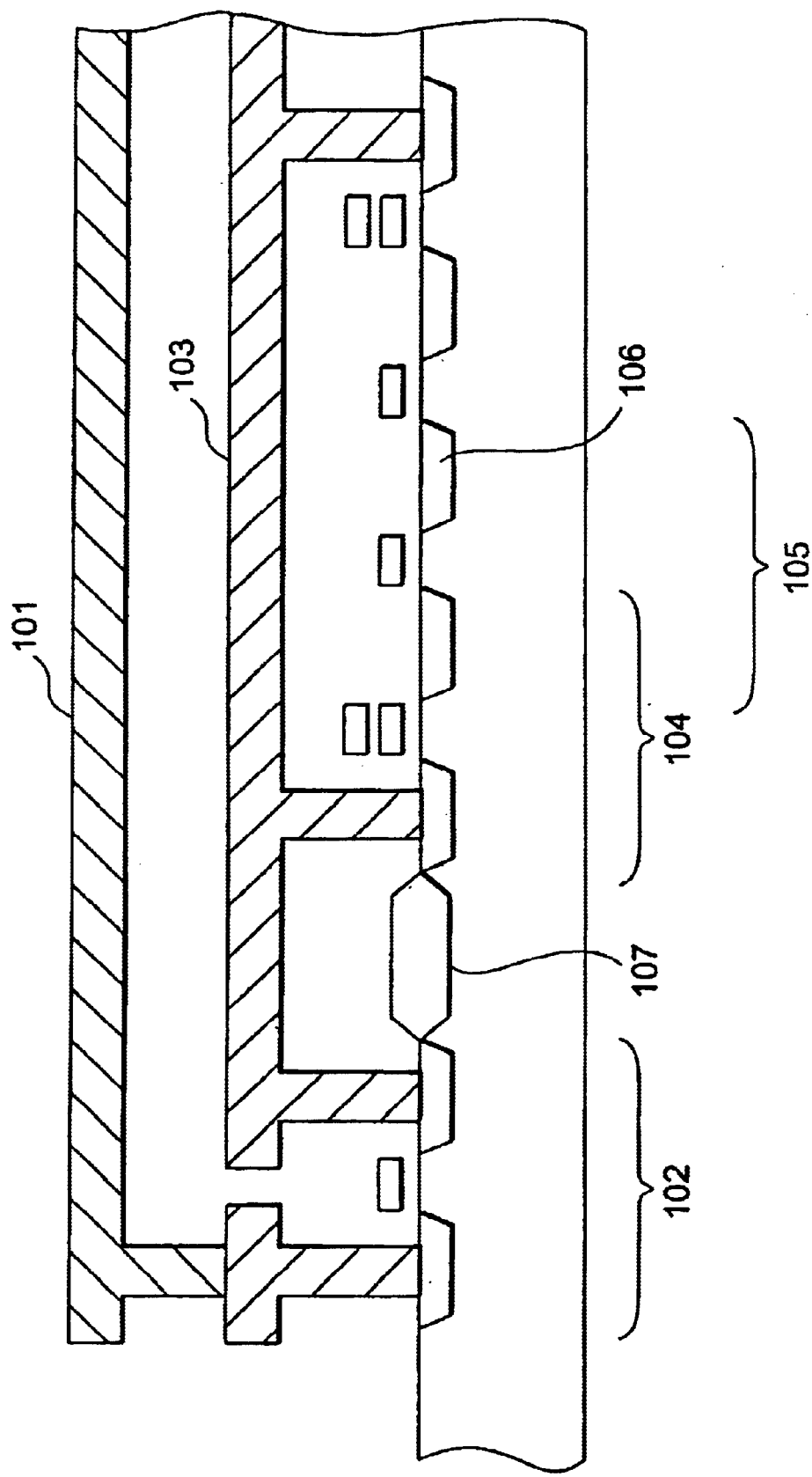
FIG. 1 is a cross section showing the configuration of a conventional device with a primary bit line and secondary bit lines.
Figure 2:
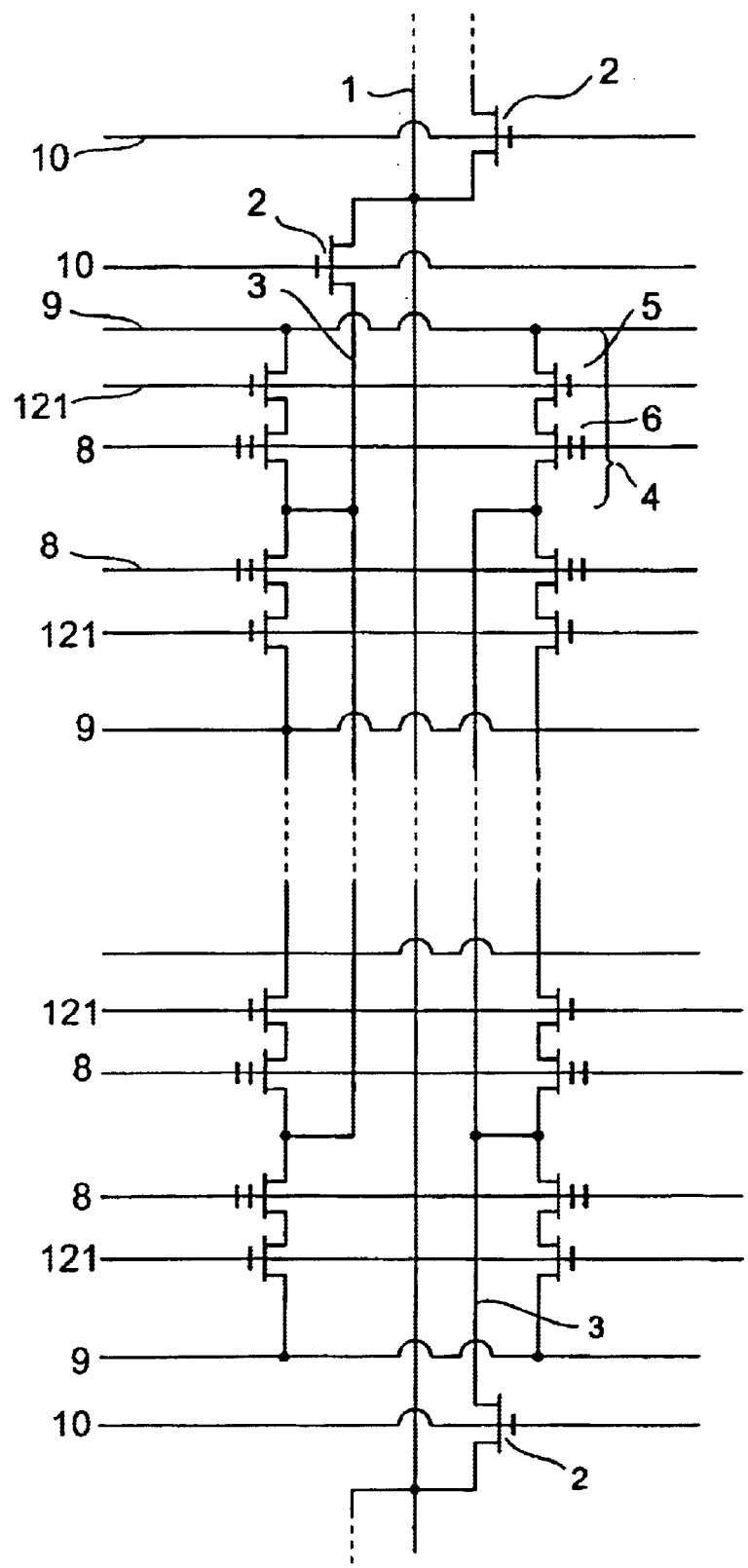
FIG. 2 illustrates a memory circuit with a primary bit line and secondary bit lines, according to the first embodiment of the present invention.

FIG. 2 illustrates the configuration of a non-volatile memory circuit with a primary bit line and secondary bit lines. This non-volatile memory circuit is comprised of a primary bit line 1, a plurality of secondary bit lines 3, a plurality of secondary bit line selection transistors 2, and a plurality of memory cells 4. Each secondary bit line selection transistor 2 is connected between each secondary bit line 3 and the primary bit line 1. And the gate of each secondary bit line selection transistor 2 is connected to its corresponding one of secondary bit line selection word-lines 10. The memory cells 4 are comprised of a plurality of memory-cell selection transistors 5 and a plurality of non-volatile memory cell transistors 6 such as an EEPROM.

Each secondary bit line 3 is electrically connected to the primary bit line 1 when its corresponding secondary bit line selection transistor 2 turns on in conformity with a signal of the secondary bit line selection word-line 10. The memory cell transistor 6 connected to a selected one of the secondary bit lines 3, is selected by a signal of the memory-cell selection word-line 8, and also electrically connected to a source line 9 via the electrically connected memory-cell selection transistor 5 in conformity with the signal of a memory-cell-selection-transistor selection word-line 121. As a result, the memory cell transistor 6 is electrically connected between the source line 9 and the primary bit line 1. When the memory cell transistor 6 is selected, the data level of either "0" or "1" stored in it is detected by a detection circuit (not shown in the figure), which is connected to the primary bit line 1.

Figure 3:
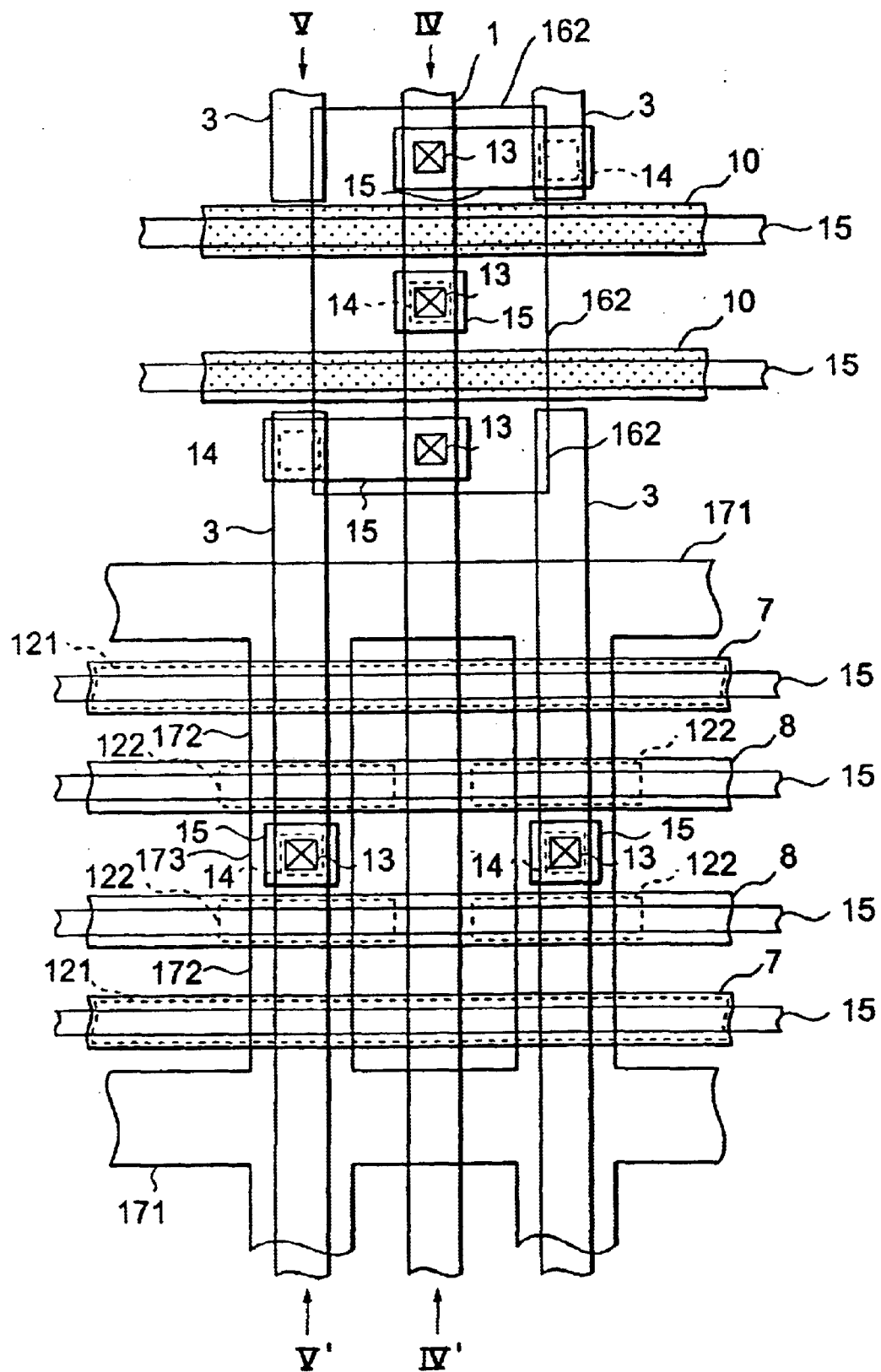
FIG. 3 illustrates an aerial view of the first embodiment of the present invention.
Figure 4:
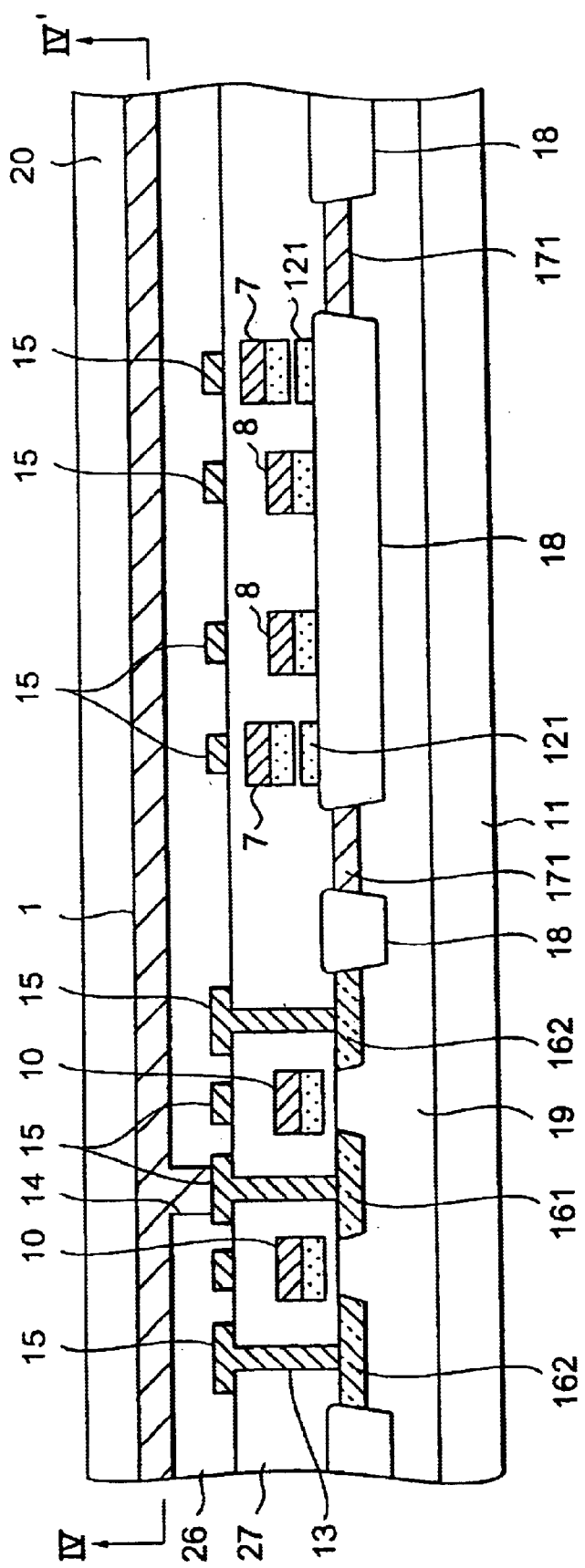
FIG. 4 is a cross section cut along a line AA' in FIG. 3.
Figure 5:
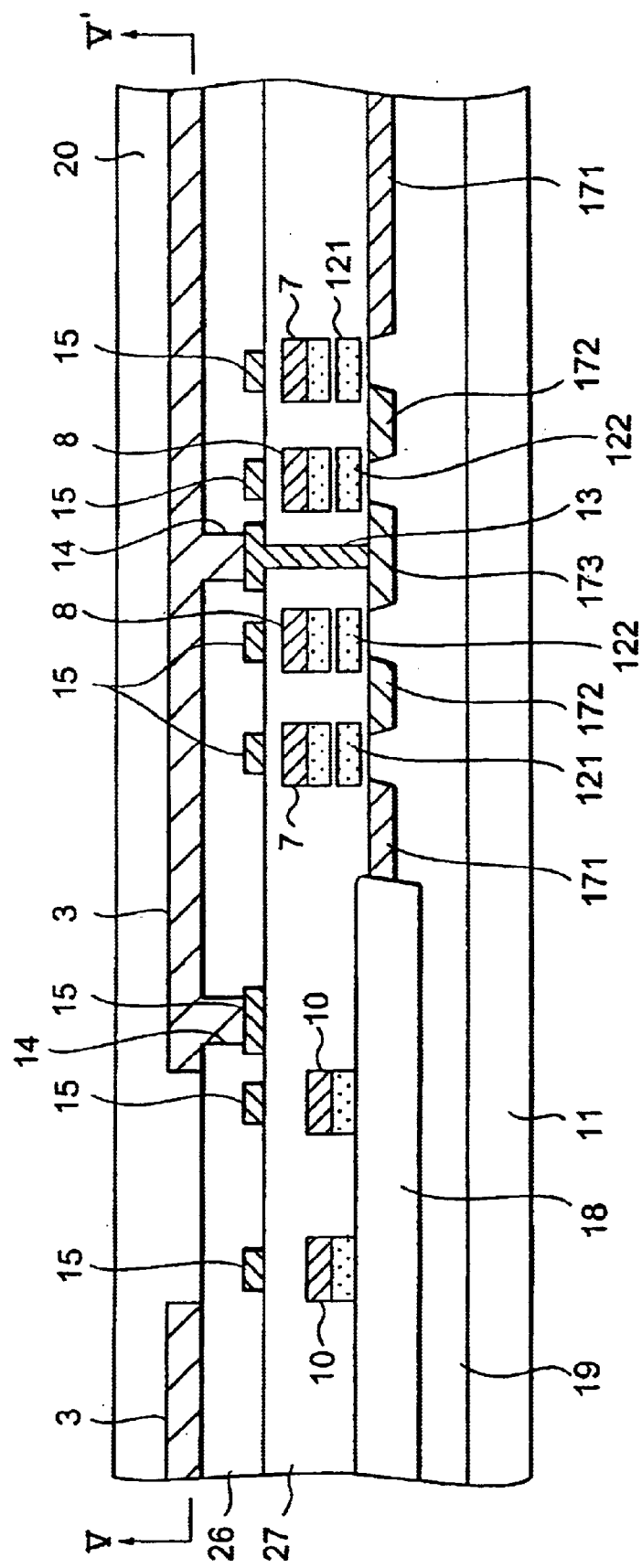
FIG. 5 is a cross section cut along a line BB' in FIG. 3.

FIG. 3 illustrates an aerial view of the configuration of the memory circuit in FIG. 2. FIG. 4 is a cross section cut along a line AA' in FIG. 3. FIG. 5 is a cross section cut along a line BB' in FIG. 3.

First, the structure of the memory cell 4 and secondary bit line selection transistor 2, formed on a semiconductor substrate 11, will be explained in short.

A device separating region 18 separates the memory cell 4 and secondary bit line selection transistor 2 from each other, and formed within a well 19, which is formed on the semiconductor substrate 11.

The memory cell 4 is made up of the memory-cell selection transistor 5 and the memory-cell transistor 6, which have almost the same device configuration.

The memory-cell selection transistor 5 is made up of diffused layers 171 and 172 and the memory-cell-selection-transistor selection word-line 121 with its part being used as the gate of the transistor 5. The memory-cell transistor 6 is comprised of the following: diffused layers 172 and 173 (i.e., a drain and source) formed within the well 19; a floating gate 122, which is formed on the gate insulating film, which is formed on the channel region between the diffused layers 172 and 173 or between the source and the drain; and the memory-cell selection word-line 8, which is formed on the insulating film formed on a floating gate 122. It is noted that a dual-layered interconnect 7, which is made up of a polysilicon and a metal silicide layer, is formed above the memory-cell-selection-transistor selection word-line 121 in the same manner as the memory-cell transistor.

The secondary bit line selection transistor 2 is comprised of diffused layers 161 and 162, which are a source and drain formed within the well 19, and a secondary bit line selection word-line 10 with its part used as the gate of the transistor 2, where this gate is fabricated, via the gate insulating film, above the channel region, which is formed between the diffused layers 161 and 162 (i.e., between the source and drain). It is noted that the secondary bit line selection word-line 10 has a dual-layered structure with low resistance, which is made up of a polysilicon and a metal silicide layer.

Next, each secondary bit line 3 to which a plurality of memory cells 4 are connected will be described.

The secondary bit line 3 is formed on an interlayer insulating film 26 using the second layer of aluminum wiring, and connected to the diffused layer 173 of the memory cell transistor 6 via a contact hole 14 formed on the interlayer insulating film 26 and a contact hole 13 formed on an interlayer insulating film 27. The contact hole 13 is made of the first layer of aluminum wiring. The upper end region is structured in a square floor cushion-wise shape larger than the contact hole 14 so that a marginal area around the contact hole 14 can be left.

Each secondary bit line 3 is connected to the diffused layer 162 of the corresponding one of the secondary bit line selection transistors 2 via the first layer of aluminum wiring, whereas the primary bit line 1, which is made of the second layer of aluminum wiring and formed on the interlayer insulating film 26, is connected to each diffused layer 161 of secondary bit selection transistor 2 via its corresponding contact hole 13 and contact hole 14 formed on the interlayer insulating film 26.

Structuring the primary bit line 1 and multiple secondary bit lines 3 from a low resistant aluminum wiring in this manner, allows for the formation of low resistant bit lines made up of the primary bit line 1 and secondary bit lines 3. As a result, each memory cell 4 can be accessed at a high speed.

As described above, the primary bit line 1 and secondary bit lines 3 are all made from the second layer of aluminum wiring. Therefore, the response time through each bit line is improved. However, the response time through each word line depends upon the resistance of the silicide word line. Each word line is made of silicide and thus has low resistance. However, since this resistance is higher than metal wiring, its response time to an input signal is long.

Accordingly, additional means for improving not only the response time of each transistor to the signal given to its gate but also the response time of the entire memory unit, are taken into consideration.

As described above, the first layer of aluminum wiring 15 is used as a relaying wiring to connect the diffused layers 161 and 162 or the diffused layer 173 to the respective second layers of aluminum wiring (the primary bit line 1 and secondary bit lines 3). Thus, the wiring density of the first layer of aluminum wiring is very low. In this embodiment, only the square floor cushion-shaped pads are formed. Thereby, the areas where the density of the first layer of aluminum wiring is low can be used for the other wiring. Lined wiring for lowering the resistance of the word lines is accordingly formed using the first layer of aluminum wiring along the secondary bit selection word lines 10, the memory-cell-selection-transistor selection word lines 121, and the memory cell selection word lines 8. Connecting this first lined layer of aluminum wiring to its corresponding word line via a contact hole allows for the formation of a very low resistant word line. Besides which, each memory cell 4 can be accessed at a high speed.

Figure 7A:
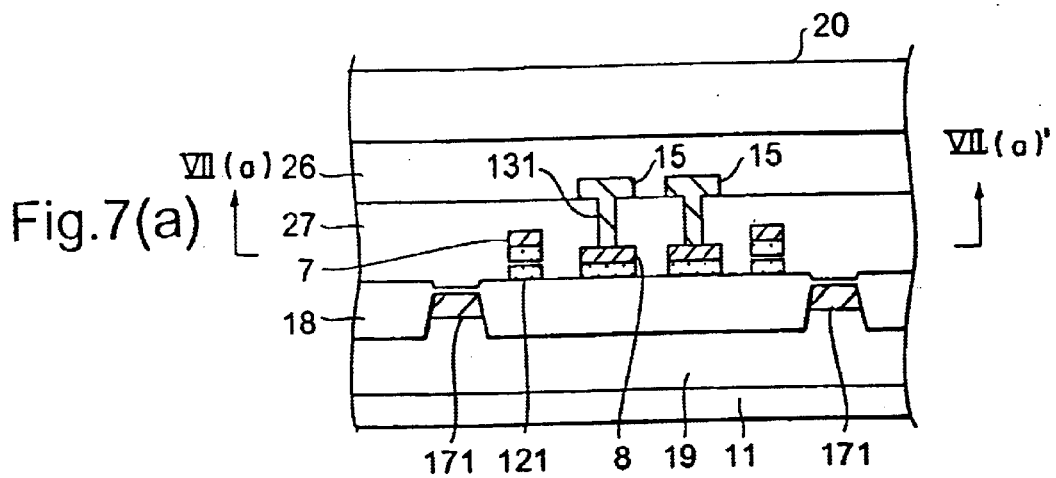
FIG. 7(a) is a cross section cut along a line CC' in FIG. 6.
Figure 7B:
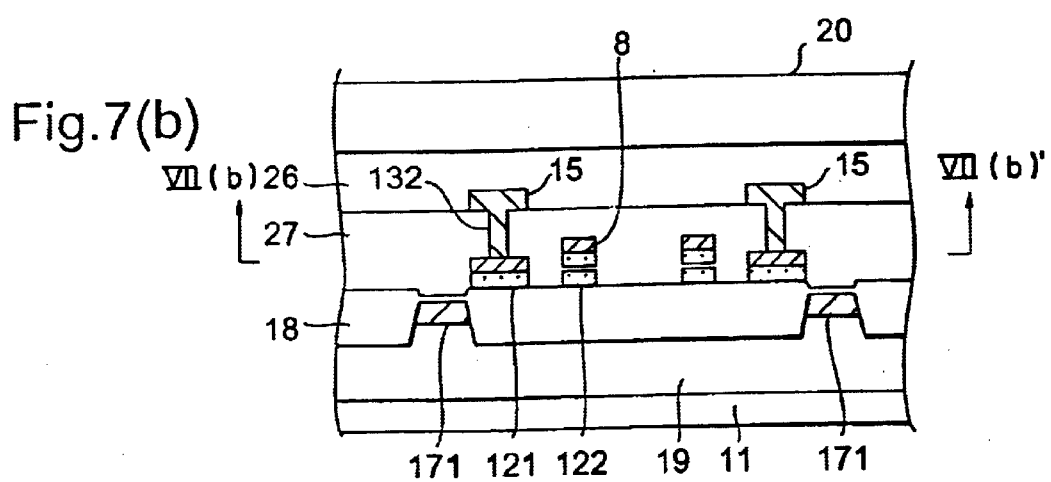
FIG. 7(b) is a cross section cut along a line DD' in FIG. 6.
Figure 7C:
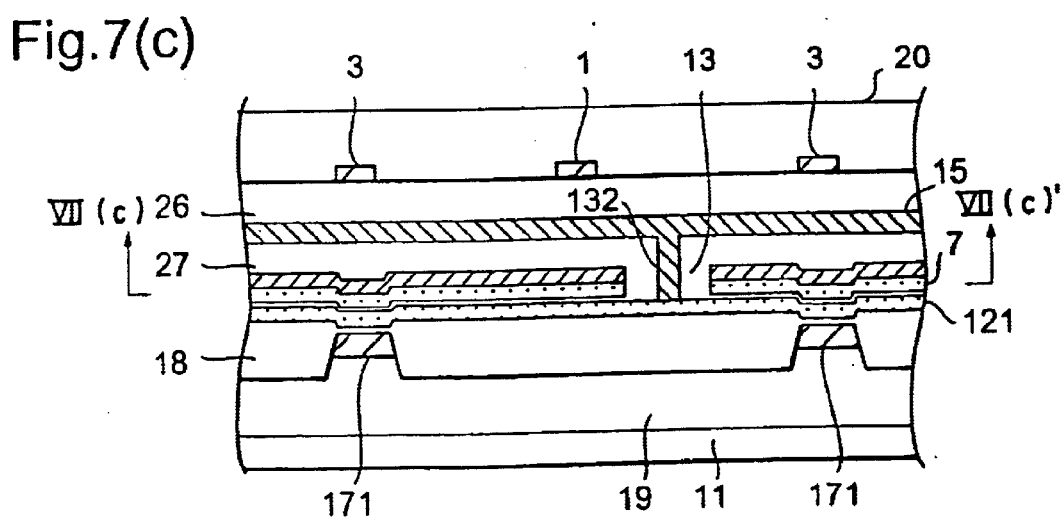
FIG. 7(c) is a cross section cut along a line EE' in FIG. 6.

The connective relationship between this lined layer of wiring and its corresponding word line is illustrated in FIGS. 6 and 7.

FIG. 6 is an aerial view expanded in the direction the word lines running in FIG. 3. The reference numerals identical to their corresponding elements in FIG. 3 are attached.

The memory cell selection word lines 8 are connected to their respective first layers of aluminum wiring 15 or lined layers of wiring formed on the interlayer insulating film 27 along the memory cell selection word lines 8, via their respective contact holes 131 formed on the interlayer insulating film 27.

FIG. 7(*a*) is a cross section cut along the line CC' in FIG. 6. The memory-cell-selection-transistor selection word lines 121 are connected to their respective first layers of aluminum wiring formed on the interlayer insulating film 27 along the memory-cell-selection-transistor selection word lines 121, via their respective contact holes 132 formed on the interlayer insulating film. Since the layers of wiring 7 are formed right above the memory-cell-selection-transistor selection word lines 121, parts of the layers of wiring 7 are removed. Contact holes 132 are then formed on the apertures. The memory-cell-selection-transistor selection word lines 121 are connected to the respective first layers of wiring 15 or lined layers of wiring formed along the word lines 121, via the respective contact holes 132. FIGS. 7(*b*) and 7(*c*) are cross-sections cut along respective lines DD' and EE' in FIG. 6. It is noted that the lined layers of wiring can be alternatively connected to the memory-cell-selection-transistor selection word lines 121 by piercing the wiring 7 without removing it. With this structure, the wiring 7 can be used for the lined layers of wiring so as to lower the resistance of the memory-cell-selection-transistor selection word lines.

Incidentally, since the secondary bit line selection word lines 10 is structured to be substantially equal to the memory cell selection word lines 8, their explanation will be omitted.

Next, the process steps of fabricating memory cells and a CMOS logical circuit, according to the present invention, will be described while referencing FIGS. 3, 8, and 9.

FIG. 8 illustrates the process steps of fabricating the memory cell region cut along a line AA' in FIG. 3, and the logical circuit region not shown in FIG. 3, whereas FIG. 9 illustrates the process steps of fabricating the memory cell region cut along a line BB' in FIG. 3, and the logical circuit region not shown in FIG. 3.

The logical circuit region is comprised of an nMOS transistor and a pMOS transistor. The nMOS transistor is comprised of an n-type source and an n-type drain region 22 in a p-type well 19, whereas the PMOS transistor is comprised of a p-type source and a p-type drain region 23 in an n-type well 21. On the other hand, the memory cell region is comprised of a secondary bit line selection nMOS transistor 2 and a memory cell nMOS transistor 6. The secondary bit line selection nMOS transistor 2 is comprised of the diffused layers 161 and 162 or an n-type source and an n-type drain region in the p-type well 19. The memory cell nMOS transistor 6 is comprised of an n-type source and an n-type drain region or diffused layers 172 and 173 in the p-type well 19, a floating gate 122, and a control gate or memory cell selection word line 8. An interlayer insulating film 27 is formed so as to cover the logical circuit and the memory cell region. Contact holes 13, which are used to establish contact with the source and drain region of each secondary bit line selection transistor 2, are formed on the interlayer insulating film 27. Other contact holes 13, which are used to establish contact with each MOS transistor formed on the interlayer insulating film 27, are formed on the interlayer insulating film 27. Since the structure as described above can be made using the conventional process techniques, its explanation will be omitted. The state of the above-mentioned structure at the time of formation is illustrated in FIGS. 8(*a*) and 9(*a*).

Afterwards, plugs with which the contact holes are to be filled are formed and an aluminum film is also formed over the entire surface by the sputtering process or the CVD process. The aluminum film is then leveled by the CMP process, and selectively etched off in accordance with the shape of the first layer of aluminum wiring. During this etching process, aluminum areas of pads larger than the square floor cushion-shaped contact hole are left intact on top of the plugs in the memory cell region. Also, the aluminum wiring or lined layers of wiring are left intact along the respective word lines. At the same time as the etching process, pads larger than the square floor cushion-shaped contact hole are formed on top of the plugs in the logical circuit region. Besides this, the wiring of an nMOS transistor and a pMOS transistor is done using the first layer of aluminum wiring so as to form, for example, a CMOS transistor. The state of the memory cell and the logical circuit region when the process up to this point is over, is illustrated in FIGS. 8(*b*) and 9(*b*).

Thereafter, an interlayer insulating film 26 is formed on the first layer of aluminum wiring, and then leveled by the CMP process, etc. Contact holes 14 are made next, so as to connect the first layer of aluminum wiring to the second layer of aluminum wiring. An aluminum film is subsequently formed over the contact holes 14 and interlayer insulating film 20 by the sputtering process or the CVD process. This formed aluminum film is then leveled and then selectively etched off so as to form the second layer of aluminum wiring 15. The second layer of aluminum wiring 15 comprises a primary bit line 1 and secondary bit lines 3 in the memory cell region, whereas it comprises a wiring used to connect it to the transistors and logical circuits in the logical circuit region.

According to the first embodiment of the present invention, since the process of forming the first and second layers of aluminum wiring can be also used to form both the logical circuit and the memory cells, the memory cells of a hybrid semiconductor device, made up of a logical circuit and memory cells, can be accessed at a higher speed without adding further processes.

The primary bit line and the secondary bit lines are formed using an aluminum wiring in such a manner where the first layer of aluminum wiring is used as relay wiring connecting a lined layer of wiring, which runs in the same direction as its corresponding word line (the second layer of aluminum wiring), and a diffused layer. These lines are formed in the same layer. This enables the formation of lined layers of wiring for the respective word lines without using another layer. As a result, low resistant bit lines and word lines can be formed without using additional processes and increasing cost, thus improving the access speed to the memory cells.

(Second Embodiment)

In the first embodiment of the present invention as described above, the primary bit line and the secondary bit lines are formed from the second layer of aluminum wiring, whereas the lined layers of wiring for the respective word lines are formed by using the first layer of aluminum wiring. In contrast, according to the second embodiment, the primary bit line and secondary bit lines are formed from the first layer of aluminum wiring, whereas the lined layers of wiring or the respective word lines are formed by using the second layer of aluminum wiring.

Since the configuration of the circuit, according to the second embodiment of the present invention, is the same as that of the first embodiment, its explanation is omitted.

Figure 10:
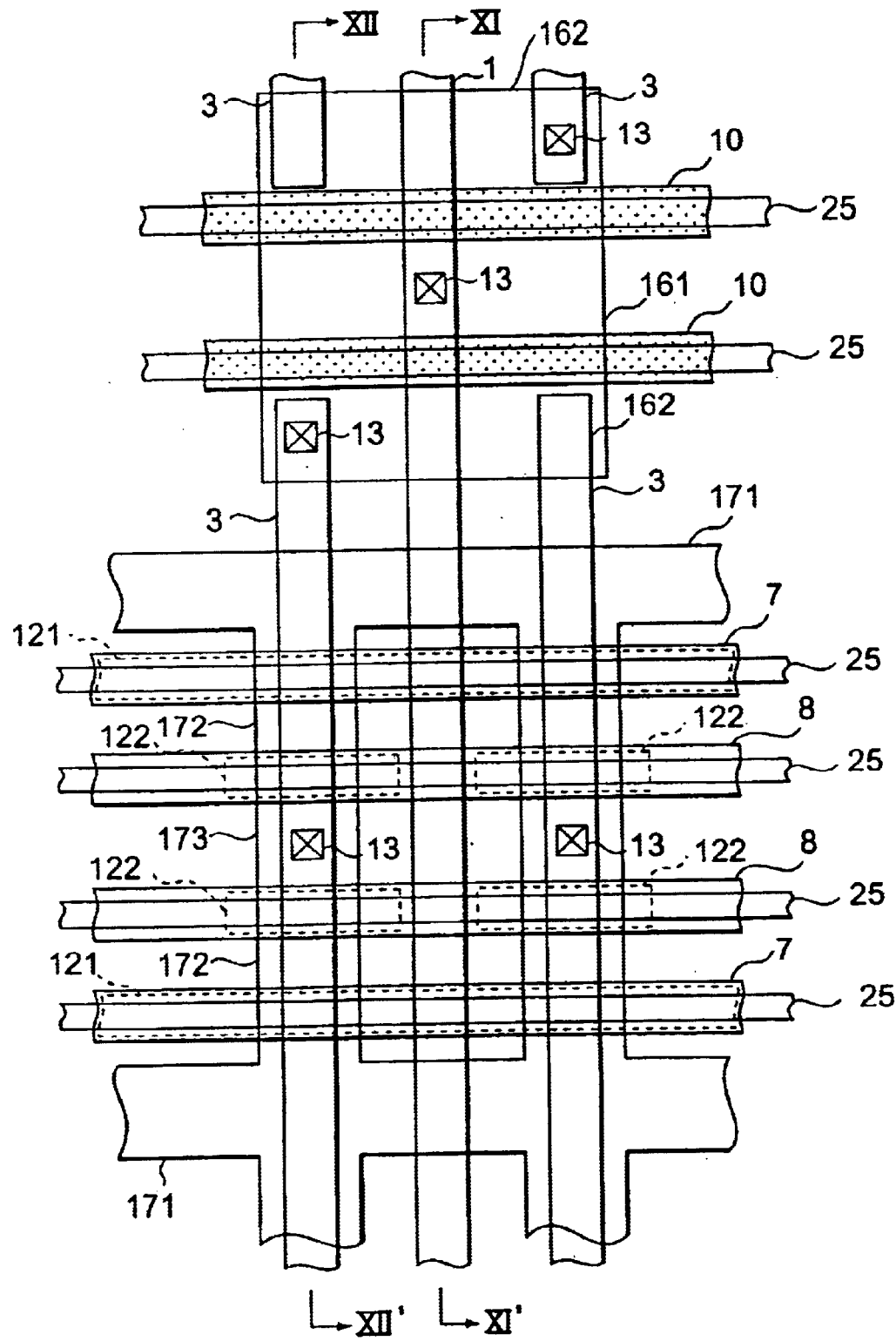
FIG. 10 is an aerial view of the second embodiment of the present invention.

An aerial view of the device structure is illustrated in FIG. 10. Cross-sections cut along respective lines II' and JJ' are illustrated in FIGS. 11 and 12.

In the second embodiment, the layout of the contact holes, lined layers of wiring, primary bit line, and secondary bit lines is different from that of the first embodiment.

Figure 11:
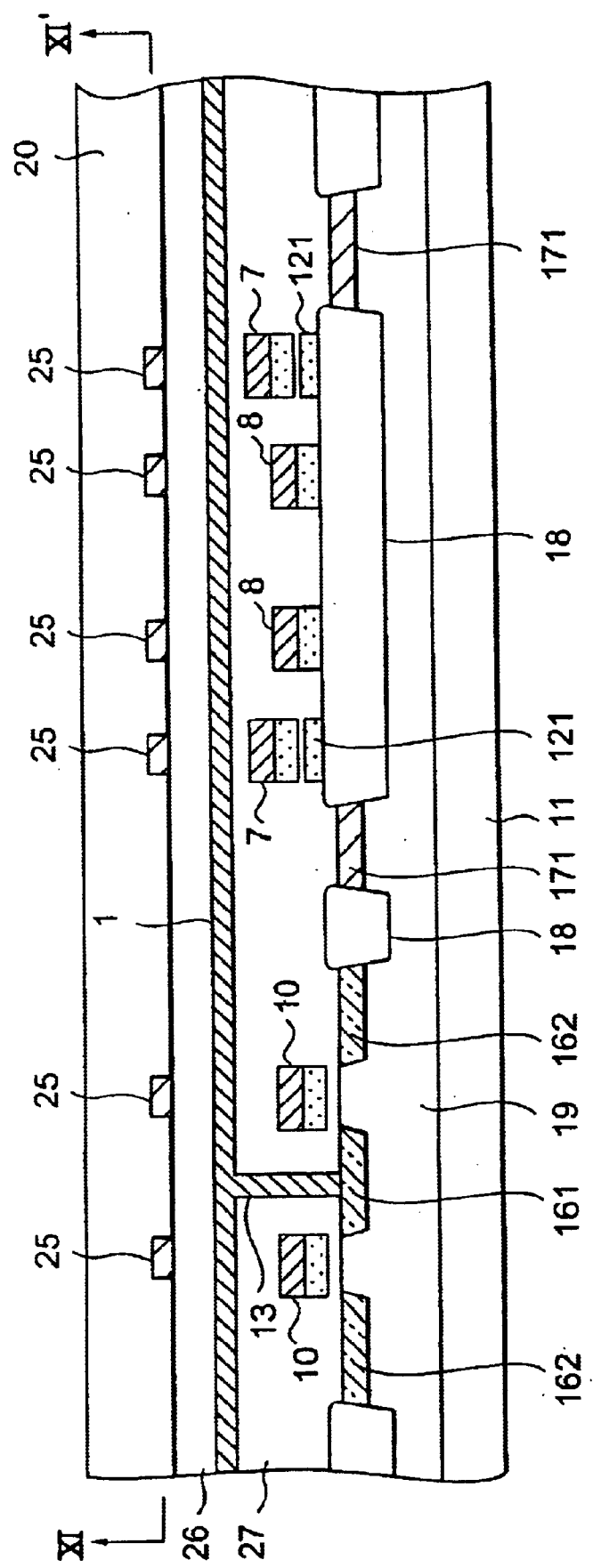
FIG. 11 is a cross section cut along a line II' in FIG. 10.

As shown in FIG. 11, the primary bit line 1, formed on the interlayer insulating film 27 by the first layer of wiring, is connected to the diffused layer of each secondary bit line selection transistor 2 via a contact hole 13. The lined layers of wiring 25 are formed along the respective secondary bit line selection word lines 10, memory cell selection word lines 121, memory-cell-selection-transistor selection word lines 8 by using the second layer of aluminum wiring.

Figure 12:
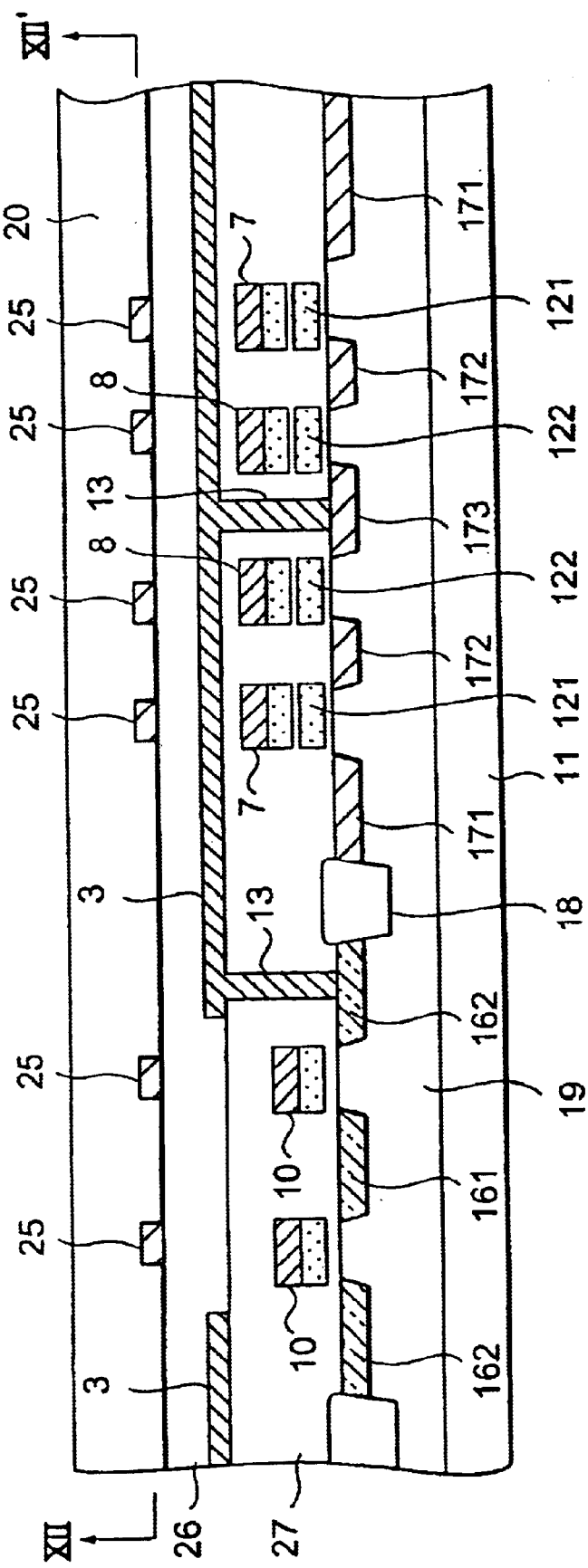
FIG. 12 is a cross section cut along a line JJ' in FIG. 10.

As shown in FIG. 12, the diffused layers 162 of the secondary bit line selection transistor 2 is connected to the secondary bit line 3, formed on the interlayer insulating film by the first layer of aluminum wiring, via a contact hole 13, whereas the secondary bit line 3 is connected to the diffused region 173 of the memory cell transistor 6 via a contact hole 13.

Figure 13:
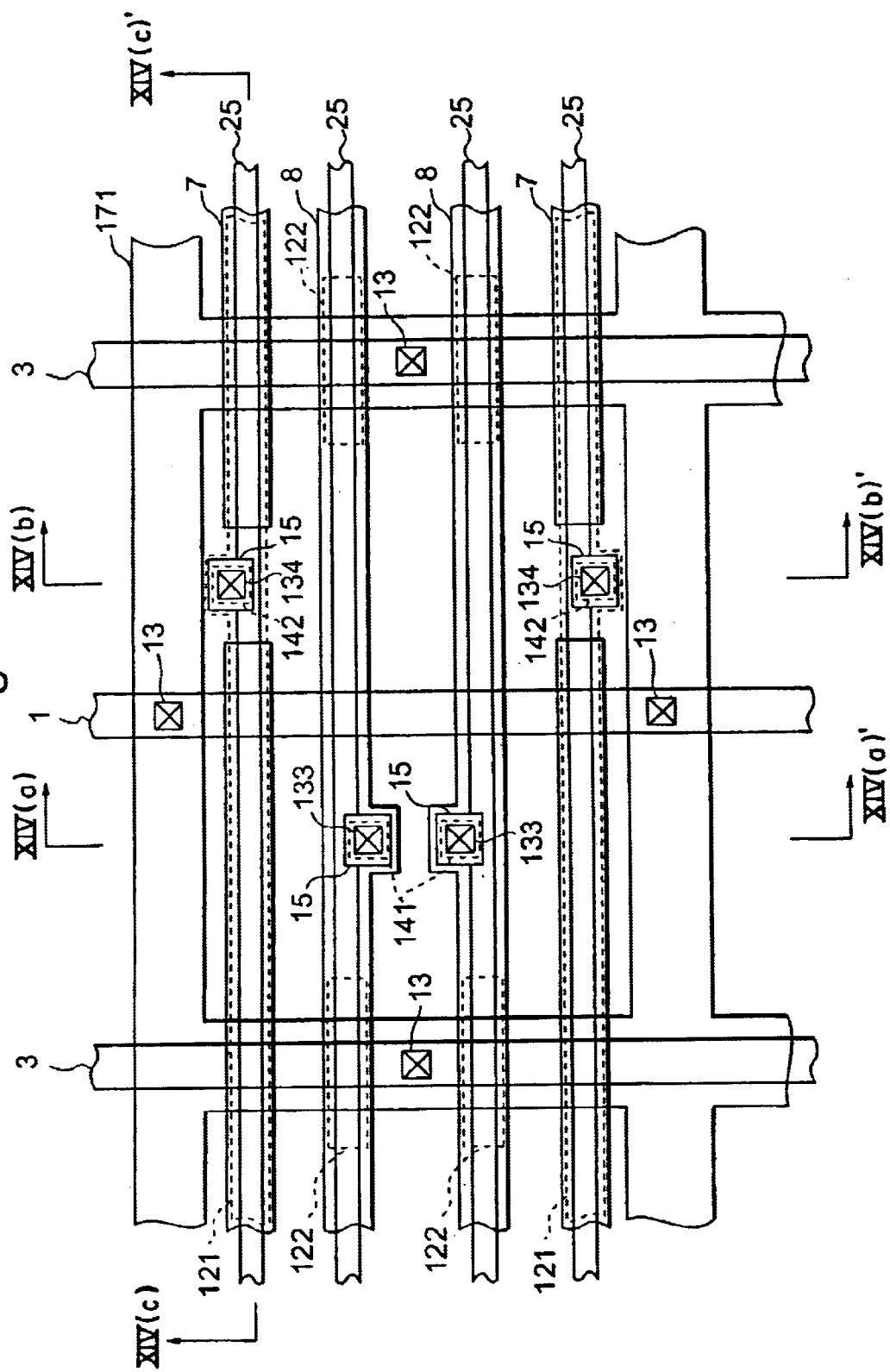
FIG. 13 is an aerial view showing an interconnection of lined wiring, according to the second embodiment of the present invention.

The relationship between the lined layer of wiring 25 formed by the second layer of aluminum wiring and its corresponding word line is illustrated in FIG. 13. Cross-sections cut along lines FF', GG' and HH' in FIG. 13 are illustrated in FIGS. 14(a), 14(b), and 14(c).

Figure 14A:
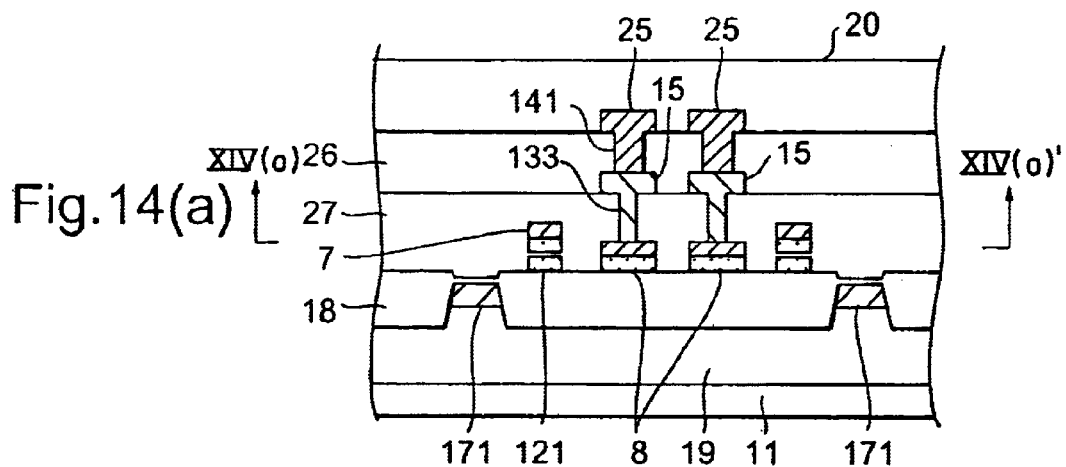
FIG. 14(a) is a cross section cut along a line FF' in FIG. 13.

The memory cell selection word lines 8, as shown in FIG. 14(a), are connected to the respective first layers of aluminum wiring 15, which are a square floor cushion-shape, via contact holes 133 formed on the interlayer insulating film 27, and also connected to the respective second layers of aluminum wiring 25, which are lined layers of wiring, via contact holes 141 formed on the interlayer insulating film 26. Each contact hole 141 is larger than its corresponding contact hole 133, but smaller than the corresponding square floor cushion-shaped pad formed by the first layer of aluminum wiring 15 so that a certain marginal space can be provided.

Figure 14B:
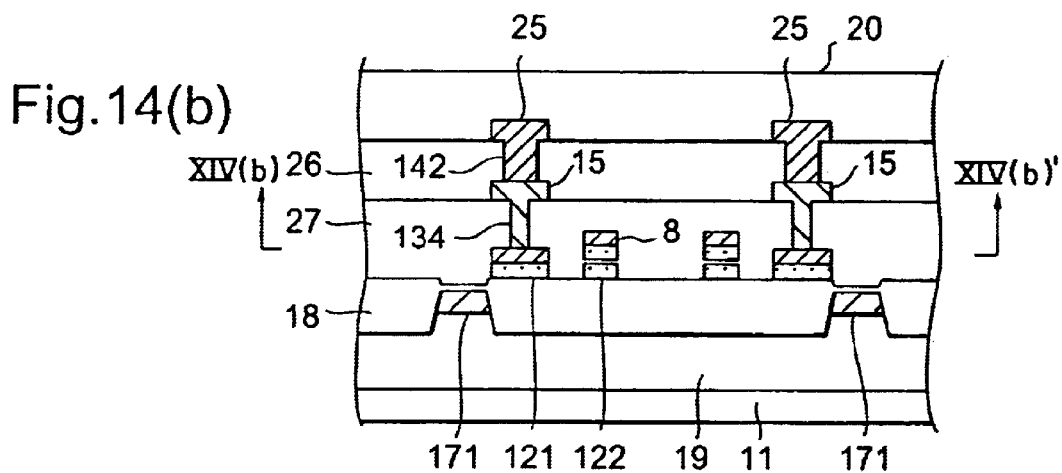
FIG. 14(b) is a cross section cut along a line GG' in FIG. 13.
Figure 14C:
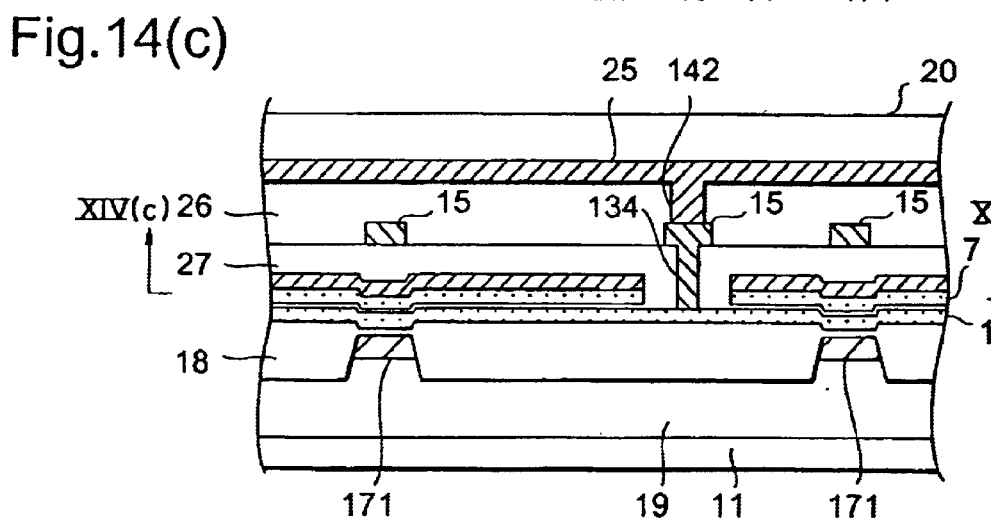
FIG. 14(c) is a cross section cut along a line HH' in FIG. 13.

The memory-cell-selection-transistor selection word lines 121, as shown in FIGS. 14(b) and 14(c), are connected to the respective square floor cushion-shaped first layers of aluminum wiring 15 via contact holes 134 formed on the interlayer insulating film 27, and also connected to the second layers of aluminum wiring 25 or lined layers of wiring, via contact holes 142 formed on the interlayer insulating film 26. The wiring 7 is selectively removed so as to expose the memory-cell-selection-transistor selection word lines 121. Alternatively, it is possible for the wiring 7 to be used as a lined layer of wiring if instead of selectively removing it, contact holes are formed running through it. However, since the second layers of aluminum wiring 25, which are lined layers of wiring, are the predominant factor in lowering resistance, with the wiring 7 only minimally contributing to this, and because the parasitic capacitance of the wiring 7 contributes to the delay in signal propagation, it is unnecessary for the wiring 7 to be connected to the memory-cell-selection-transistor selection word line 121 in the second embodiment. If the parasitic capacitance of the wiring 7 is small, the wiring 7 can be further used as a lined layer of wiring.

The secondary bit line selection word line 10, which is not shown in the Figures, is connected to a lined layer of wiring formed by the second layer of aluminum via the contact hole 133 and 141.

With this arrangement, the second embodiment can provide low resistant bit lines and word lines like the first embodiment.

According to the first embodiment, as shown in FIG. 3, contact holes 13 and 14 are needed for every two memory cells. Besides, as shown in FIG. 6, each memory-cell-selection-transistor selection word line 121 needs a contact hole 132; each memory cell selection word line 8, a contact hole 131; and each secondary bit line selection word line 10, a contact hole (not shown in the figure) formed on the interlayer insulating film 27. However, according to the second embodiment, as shown in FIG. 10, a contact hole 13 is needed for every two memory cells. Besides, as shown in FIG. 13, each memory-cell-selection-transistor selection word line 121 needs contact holes 13 and 14; each memory cell selection word line 8, contact holes 13 and 14; and each secondary bit line selection word line 10, contact holes (not shown in the figure) formed on the respective interlayer insulating films 27 and 26. However, the contact hole used to connect the memory cell to a lined layer of wiring is unnecessary for each memory cell. Whether or not it is necessary is determined based upon the resistance of each word line. Therefore, the structure according to the second embodiment allows a decrease in the total number of contact holes. This controls the occurrence of defects on the contact holes and improves yield.

Furthermore, in the case where the logical circuit is structured using aluminum wiring, the primary bit line and the secondary bit lines can be formed by the same aluminum wiring layer if lined layers of wiring are not formed for the respective word lines. Therefore, the designing degree of freedom is improved.

As described above, according to the present invention, since the primary bit line and secondary bit lines are all structured by a metal wiring, low resistant bit lines can be provided. Besides, the formation of lined layers of wiring for the respective word lines provides low resistant word lines. Accordingly, each memory cell can be accessed at a higher speed.

A semiconductor device, according to the present invention, has been described in connection with certain preferred embodiments. It is to be understood that the subject matter encompassed by the present invention is not limited to these specific embodiments. On the contrary, it is intended to include all alternatives, modifications, and equivalents as can be included within the spirit and scope of the following claims.

What is claimed is:

1. A semiconductor device, comprising:
   a primary bit line;
   a plurality of secondary bit lines, each of said plurality of secondary bit lines being elongated to run substantially parallel to said primary bit line;
   a plurality of bit line selection transistors, each of said bit line selection transistors being connected between said primary bit line and an associated one of said plurality of secondary bit lines; and
   a plurality of sets of memory cells, each of said plurality of sets of memory cells including a plurality of memory cells and being coupled to said associated one of said secondary bit lines;
   wherein said primary bit line and said plurality of secondary bit lines are structured using the same layer of wiring.

2. The semiconductor device according to claim 1, wherein said primary bit line and said secondary bit lines are both formed by a metal wing.

3. The semiconductor device according to claim 1, wherein each of said plurality of memory cells includes a floating gate, a control gate, and diffused layers connected to said secondary bit lines; and wherein a memory cell selection word line that transmits a signal to said control gate is formed by a different layer of wiring from that of said secondary bit lines; wherein said semiconductor device further comprises a lined layer of wiring connected to said memory cell selection word line.

4. The semiconductor device according to claim 1, wherein each of said plurality of memory cells comprises a first transistor, which includes a first diffused layer, a second diffused layer, a floating gate formed on a channel region between said first and second diffused layers, and a control gate formed on said floating gate, and a second transistor, which includes said second diffused layer, a third diffused layer, and a selective gate formed above the channel between said second and said third diffused layer; wherein said primary bit line and said plurality of secondary bit lines are all formed by a different layer of wiring from that used for both a memory cell selection word line that transmits a signal to said control gate and a memory-cell-selection-tranisistor selection word line that transmits a signal to said selective gate; and lined layers of wiring, connected to the respective memory cell selection word line and memory-cell-selection-transistor selection word line, which is structured by a different layer of wiring from those of said memory cell selection word line, said memory-cell-selection-transistor selection word line, and said primary bit line and said secondary bit lines.

5. A semiconductor device, comprising:
   a first and second diffused layer, which are formed on a semiconductor substrate;
   a selective transistor, which is connected in series to a memory cell transistor with both a floating gate and control gate between said first and second diffused layer, and includes a selective gate;
   a memory cell selection word line, which transmits a signal to said control signal;
   a memory-cell-selection-transistor selection word line, which transmits a signal to said selective gate;
   a first insulating film, which covers said memory cell transistor, said selective transistor, said memory cell selection word line, and said memory-cell-selection-transistor selection word line;
   a first contact hole, which exposes the surface of said first diffused layer formed in said first insulating film;
   a first conductive material, which fills said first contact hole and connects to said diffused layer;
   a first and second lined layers of wiring, which are formed on said first insulating film along both said memory cell selection word line and said memory-cell-selection-transistor selection word line;
   a second contact hole, which is formed in said first insulating film and connects said first lined layer of wiring to said memory cell selection word line;
   a third contact hole, which is formed in said first insulating film and connects said second lined layer of wiring to said memory-cell-selection-transistor selection word line;
   a second insulating film, which covers said first and said second lined layer of wiring;
   a fourth contact hole, which is formed in said second insulating film so as to expose said first contact hole;
   a second conductive material, which fills said fourth contact hole and connects to said first conductive material;
   a primary bit line, which is formed on said second insulating film;
   a plurality of secondary bit lines formed on said second insulating film and connected to said second conductive material, each of said plurality of secondary bit lines being elongated to run substantially parallel to said primary bit line; and
   a switching device being connected between said primary bit line and an associated one of said plurality of secondary bit lines.

6. The semiconductor device according to claim 5, wherein said primary bit line and said secondary bit line intersect said lined layer of wiring.

7. The semiconductor device according to claim 5, wherein said switching device comprises: a third diffused layer, which is connected to said secondary bit line via both a fifth contact hole formed on said second insulating film and a sixth contact hole formed, corresponding to said fifth contact hole, on said first insulating film; a fourth diffused layer, which is connected to said primary bit line via both a seventh contact hole formed on said second insulating film and an eighth contact hole formed, corresponding to said seventh contact hole, on said first insulating film; and a secondary bit line selection gate, which is formed above a channel region between said third and said fourth diffused layer.

8. The semiconductor device according to claim 7, further comprising:
   a secondary bit line selection word line, which is formed on said first insulating film and transmits a signal to said secondary bit line selection gate; and
   a third lined layer of wiring, which is formed on said first insulating film along said secondary bit line selection word line and is connected to said secondary bit line selection word line.

9. The semiconductor device according to claim 5, further comprising:
   a third lined layer of wiring formed between said second lined layer of wiring and said selective transistor selection word line along said selective transistor selection word line.

10. The semiconductor device according to claim 5, wherein said switching device comprises a bit line selection transistor.

11. The semiconductor device according to claim 5, wherein said switching device comprises a plurality of bit line selection transistors with a corresponding one of said bit line selection transistors respectively disposed between said primary bit line and a corresponding one of said plurality of secondary bit lines.

12. A semiconductor device, comprising:
   a first and second diffused layer, which are formed on a semiconductor substrate;
   a memory cell selection transistor, which is connected in series to a memory cell transistor with both a floating gate and control gate being between said first and second diffused layer, and includes a selective gate;
   a memory cell selection word line, which transmits a signal to said control gate;
   a memory-cell-selection-transistor selection word line, which transmits a signal to said selective gate;
   a first insulating film, which covers said memory cell transistor, said memory cell selection transistor, said memory cell selection word line, and said memory-cell-selection-transistor selection word line;
   a first contact hole, which exposes a surface of said first diffused layer and is formed in said first insulating film;
   a first conductive material, which fills said first contact hole and connects to said first diffused layer;
   a secondary bit line, which is formed on said first insulating film and is connected to said first conductive material;
   a third and a fourth diffused layer formed on said semiconductor substrate;
   a secondary bit line selection transistor with a secondary bit selection gate formed above a channel region between said third and said fourth diffused layer;
   a second contact hole, which is formed, corresponding to said third diffused layer, in said first insulating film;
   a second conductive material, which fills said second contact hole and connects said third diffused layer to said secondary bit line;
   a third contact hole, which is formed, corresponding to said fourth diffused layer, in said first insulating film;
   a third conductive material, which fills said third contact hole and is connected to said fourth diffused layer; and
   a primary bit line, which is formed on said first insulating film and is connected to said third conductive material;
   wherein said secondary bit line is elongated to run substantially parallel to said primary bit line.

13. The semiconductor device according to claim 12, further comprising: a second insulating film, which covers said secondary bit line and said primary bit line, and a first lined layer of wiring, which is formed on said second insulating film along said memory cell selection word line and connected to a fourth contact hole formed in both said memory cell selection word line and said second insulating film.

14. The semiconductor device according to claim 13, further comprising a second lined layer of wiring, which is formed on said second insulating film along said memory-cell-selection-transistor selection word line and connected to a fifth contact hole formed in both said memory-cell-selection-transistor selection word line and said second insulating film.

15. The semiconductor device according to claim 13, further comprising a third lined layer of wiring, which is formed on said second insulating film along said secondary bit line selection word line and connected to a sixth contact hole formed in both said secondary bit line selection word line and said second insulating film.

16. The semiconductor device according to claim 12, further comprising:
   a fourth lined layer of wiring formed between said second insulating film and said memory-cell-selection-transistor selection word line.

* * * * *